(12) United States Patent
Inoue et al.

(10) Patent No.: US 7,488,619 B2
(45) Date of Patent: Feb. 10, 2009

(54) METHOD AND APPARATUS FOR MANUFACTURING IC CHIP PACKAGED DEVICE

(75) Inventors: Taichi Inoue, Ise (JP); Sumihiro Arima, Ise (JP); Kazutaka Nagano, Ise (JP); Masashi Morita, Ise (JP)

(73) Assignee: Shinko Electric Co., Ltd., Tokyo (JP)

( * ) Notice: Subject to any disclaimer, the term of this patent is extended or adjusted under 35 U.S.C. 154(b) by 301 days.

(21) Appl. No.: 10/595,979

(22) PCT Filed: Dec. 22, 2004

(86) PCT No.: PCT/JP2004/019233

§ 371 (c)(1),
(2), (4) Date: May 23, 2006

(87) PCT Pub. No.: WO2005/064667

PCT Pub. Date: Jul. 14, 2005

(65) Prior Publication Data

US 2007/0085069 A1    Apr. 19, 2007

(30) Foreign Application Priority Data

Dec. 26, 2003  (JP) ............... 2003-435441
Jun. 25, 2004  (JP) ............... 2004-188114

(51) Int. Cl.
*H01L 21/50*    (2006.01)
*H01L 21/48*    (2006.01)
*H01L 21/44*    (2006.01)
*H01L 23/02*    (2006.01)
*G08B 13/14*    (2006.01)
*G11C 11/24*    (2006.01)
*B23P 19/00*    (2006.01)

(52) U.S. Cl. ............... 438/107; 438/106; 257/679; 340/572.7; 365/149; 29/740

(58) Field of Classification Search ............. 438/106, 438/107; 257/679; 340/572.7; 365/149; 29/740
See application file for complete search history.

(56) References Cited

U.S. PATENT DOCUMENTS

| | | | | |
|---|---|---|---|---|
| 6,147,662 A * | 11/2000 | Grabau et al. | ............... | 343/895 |
| 6,332,268 B1 * | 12/2001 | Imanishi et al. | ............... | 29/832 |
| 6,451,154 B1 * | 9/2002 | Grabau et al. | ............... | 156/300 |
| 6,972,394 B2 * | 12/2005 | Brod et al. | ............. | 219/121.85 |
| 7,278,203 B2 * | 10/2007 | Aoyama et al. | ............... | 29/740 |

FOREIGN PATENT DOCUMENTS

| | | |
|---|---|---|
| JP | 61-036938 A | 2/1986 |
| JP | 06-224914 | 8/1994 |
| JP | 2002-234529 A | 8/2002 |
| JP | 2003-006596 A | 1/2003 |
| JP | 2003-058848 A | 2/2003 |
| JP | 2003-168099 A | 6/2003 |
| JP | 2005-014243 A | 1/2005 |
| JP | 2005-038923 A | 2/2005 |

* cited by examiner

*Primary Examiner*—Luan C Thai
(74) *Attorney, Agent, or Firm*—Darby & Darby PC

(57) ABSTRACT

A film substrate that has antenna circuits formed at a fixed spacing on one surface thereof is transported at a constant speed, and IC chips are moved along the film substrate, and are mounted at the fixed spacing on the film substrate so as to be connected to the antenna circuits.

13 Claims, 11 Drawing Sheets

METHOD AND APPARATUS FOR MANUFACTURING IC CHIP PACKAGED DEVICE

TECHNICAL FIELD

The present invention relates to a method and apparatus for manufacturing an IC chip packaged device.

Priority is claimed on Japanese Patent Application No. 2003-435441, filed Dec. 26, 2003, and Japanese Patent Application No. 2004-188114, filed Jun. 25, 2004 the contents of which are incorporated herein by reference.

BACKGROUND ART

Recently, IC chip packaged devices that are known as radio frequency identification (RFID) cards have appeared. These have memory and a miniature antenna inside them and, by transmitting information while in a non-contact state with a reader antenna, are able to record required information in memory, and, where necessary, record, rewrite, and read information on a communication instrument such as a reader writer in a short time period.

An apparatus that manufactures an IC chip packaged device such as this RFID card has been proposed (see, for example, Patent Document 1: Japanese Unexamined Patent Application, First Publication No. 2003-6596) that manufactures an IC chip packaged device by, for example, transporting a base sheet that has one adhesive surface using a conveyor, and then bonding a circuit sheet on which an antenna circuit and an IC chip have been formed onto this adhesive surface, and then further bonding thereon a cover sheet that has one adhesive surface. Another apparatus has been proposed that manufactures an IC chip packaged device by transporting a base sheet that has an adhesive agent coated on one surface thereof using a conveyor, and then bonding a circuit sheet that is the same as that described above onto this adhesive surface, and then further bonding thereon a cover sheet using an adhesive agent, and a further apparatus has been proposed that manufactures an IC chip packaged device by transporting a film substrate that has an antenna circuit formed on one surface thereof using a conveyor, and then mounting thereon an IC chip such that it is connected to the antenna circuit (see, for example, Patent Document 2: Japanese Unexamined Patent Application, First Publication No. 2003-58848, and Patent Document 3: Japanese Unexamined Patent Application, First Publication No. 2003-168099).

However, in the above described conventional apparatuses for manufacturing an IC chip packaged device, the following problems remain. Namely, in a conventional apparatus for manufacturing an IC chip packaged device, when mounting an IC chip on a film substrate, the circuit sheet or IC chip is bonded after the base sheet or film substrate has been temporarily stopped. Accordingly, it is difficult to increase the speed of manufacturing the IC chip packaged device.

The present invention was conceived in view of the above described problems and it is an object thereof to provide a method of manufacturing an IC chip packaged device and an apparatus for manufacturing an IC chip packaged device that make it possible to manufacture IC chip packaged devices at high speed.

DISCLOSURE OF INVENTION

The present invention employs the following structure in order to solve the above described problems. Namely, the present invention is a method of manufacturing an IC chip packaged device in which a film substrate that has antenna circuits formed at a fixed spacing on one surface thereof is transported at a constant speed, and, IC chips are moved along the film substrate, and are mounted at the fixed spacing on the film substrate so as to be connected to the antenna circuits.

In addition, the present invention is an apparatus for manufacturing an IC chip packaged device that includes: a transporting section that transports a film substrate that has antenna circuits formed at a fixed spacing on one surface thereof at a constant speed; and an IC chip mounting section that mounts IC chips on the film substrate, in which the IC chip mounting section is provided with: a synchronized roller section that, while moving the IC chips along the film substrate, mounts them at the fixed spacing on the film substrate that is being transported at the constant speed; and an IC chip supply section that supplies the IC chips to the synchronized roller section.

In the method for manufacturing an IC chip packaged device and the apparatus for manufacturing an IC chip packaged device of the present invention, when an IC chip mounting section mounts IC chips at a predetermined position on antenna circuits that are formed on a film substrate, a synchronized roller section mounts the IC chips as they are moved at a speed that is synchronized with the transporting speed of the film substrate. Accordingly, because the IC chips can be mounted without the film substrate needing to be momentarily stopped, the manufacturing efficiency of the IC chip packaged devices is improved.

Moreover, the number of IC chip packaged devices that can be manufactured per unit time is increased, and a reduction in the cost of the IC chip packaged devices can be achieved.

Furthermore, by transporting the film substrate at a constant speed, there are no adverse effects on the film substrate.

In the method of manufacturing an IC chip packaged device according to the present invention, it is preferable for an image of the IC chip to be picked up, and for a correction amount for correcting the position where the IC chip is to be mounted to then be calculated from the picked up image, and for the position where the IC chip is to be mounted to then be corrected.

In the method of manufacturing an IC chip packaged device according to the present invention, by picking up an image of an IC chip and then correcting the position where the IC chip is to be mounted from the picked up image, the IC chip can be mounted in a predetermined mounting position. As a result, the yield of manufactured IC chip packaged devices is improved.

Moreover, in the apparatus for manufacturing an IC chip packaged device of the present invention, it is preferable for the IC chip mounting section to be provided with a plurality of the synchronized roller sections.

In the apparatus for manufacturing an IC chip packaged device of the present invention, because IC chips are mounted on antenna circuits on a film substrate from a plurality of synchronized rollers, it is possible to shorten the interval between mounting IC chips. Accordingly, the manufacturing of IC chip packaged devices can be performed even more efficiently.

Moreover, in the apparatus for manufacturing an IC chip packaged device of the present invention, it is preferable if, of the plurality of synchronized roller sections, at least one is a dedicated backup synchronized roller section that mounts an IC chip on the antenna circuit where an IC chip has not been mounted by the other synchronized roller sections.

In the apparatus for manufacturing an IC chip packaged device of the present invention, if it is not possible for another synchronized roller to mount an IC chip on an antenna circuit of the film substrate, the dedicated backup synchronized roller mounts the IC chip. As a result, the occurrence of IC chip packaged devices on which no IC chip has been packaged is controlled, and the manufacturing yield of the IC chip packaged devices is improved.

In addition, the present invention is an apparatus for manufacturing an IC chip packaged device that includes: a transporting section that transports a film substrate; and an IC chip mounting section that mounts IC chips on the film substrate, in which the transporting section has a surface supporting section that supports on its surface the film substrate from a position in front of a mounting position where the IC chip is mounted by the IC chip mounting section to a position behind the mounting position, and the IC chip mounting section has a synchronized roller section that, while moving the IC chips at the same speed as the film substrate, mounts the IC chips on the film substrate, and an IC chip supply section that supplies the IC chips to the synchronized roller section.

According to this invention, when the IC chip mounting section mounts an IC chip on a film substrate, the synchronized roller section mounts the IC chips while moving them at the same speed as the transporting speed of the film substrate. As a result, because the IC chips can be mounted without the film substrate needing to be momentarily stopped, the manufacturing efficiency of the IC chip packaged devices is improved. Here, if the film substrate is supported by the surface supporting section when an IC chip is being mounted on an IC chip mounting position, then any vibration of the film substrate is suppressed. As a result, the IC chip mounting position is stable and the yield is improved.

Moreover, the number of IC chip packaged devices that can be manufactured per unit time is increased, and a reduction in the cost of the IC chip packaged devices can be achieved.

In the apparatus for manufacturing an IC chip packaged device of the present invention, it is preferable for the surface supporting section to have a suction mechanism that suctions the film substrate.

According to this invention, because the film substrate is suctioned between a position in front of and a position behind the IC chip mounting position, the IC chip mounting position is even more stable.

The present invention is also an apparatus for manufacturing an IC chip packaged device that includes: a transporting section that transports a film substrate; and an IC chip mounting section that mounts IC chips on the film substrate, in which the IC chip mounting section has a synchronized roller section that, while moving the IC chips at the same speed as the film substrate, mounts them on the film substrate, and an IC chip supply section that supplies the IC chips to the synchronized roller section, and the synchronized roller section is provided with a roller that axially rotates around an axis of rotation and mounts the IC chips on the film substrate, and protruding portions that hold the IC chips at a distal end portion are formed on a circumferential surface of the roller.

According to this invention, as is described above, because the IC chips can be mounted without the film substrate needing to be momentarily stopped, the manufacturing efficiency of the IC chip packaged devices is improved. Here, because protruding portions that make contact with the film substrate when the synchronized roller section is axially rotating around an axis of rotation are provided on the roller, IC chips can be mounted on the film substrate without the roller being moved up and down. As a result, the IC chip mounting position is stable.

According to the IC chip packaged device manufacturing method and the IC chip packaged device manufacturing apparatus of the present invention, when the IC chips are mounted on the film substrate on which the antenna circuits are formed, because IC chips can be mounted on a film substrate on which antenna circuits have been formed without the film substrate having to be momentarily stopped, the manufacturing efficiency of the IC chip packaged devices is improved. Accordingly, a reduction in the cost of the IC chip packaged devices is achieved.

BEST MODE FOR CARRYING OUT THE INVENTION

The first embodiment of the apparatus for manufacturing an IC chip packaged device of the present invention will now be described with reference made to FIGS. 1 through 10.

An apparatus 1 for manufacturing an IC chip packaged device of the present invention is an apparatus that manufactures an IC chip packaged device in the form of, for example, an ID tag 2.

Figure 1:
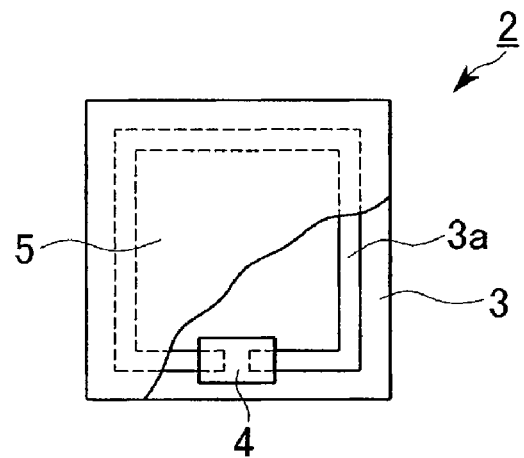
FIG. 1 is a plan view showing an ID tag according to a first embodiment of the present invention.
Figure 2:
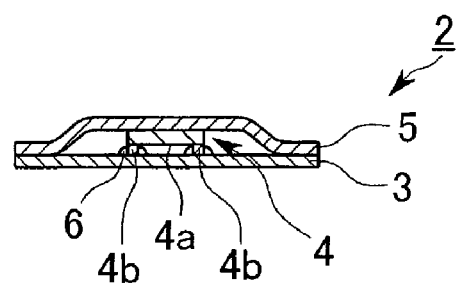
FIG. 2 is a cross-sectional view showing the ID tag shown in FIG. 1.

As is shown in FIGS. 1 and 2, this ID tag 2 is formed by a film substrate 3 that has antenna circuits 3a formed at predetermined positions thereon, IC chips 4 that are mounted at a predetermined position on each antenna circuit 3a, and a cover sheet 5.

Figure 3:
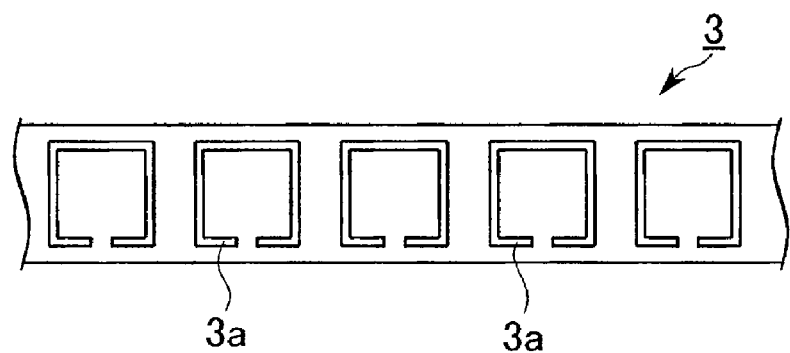
FIG. 3 is a plan view showing the film substrate shown in FIG. 1.

The antenna circuits 3a are formed on the film substrate 3 in advance by etching or by using a printing technique. As is shown in FIG. 3, the antenna circuits 3a are provided consecutively at equal intervals on the film substrate 3.

The IC chips 4 are provided with bumps 4b that are formed, for example, of copper or gold on a rear surface 4a of the IC chip 4 so that the IC chips 4 can be connected to the antenna circuits 3a. The IC chips 4 are connected to the antenna circuits 3a via an adhesive agent 6 that is formed, for example, by an anisotropic conductive paste.

The cover sheet 5 has one adhesive surface and is positioned so as to cover the film substrate 3 and the IC chips 4.

Figure 4:
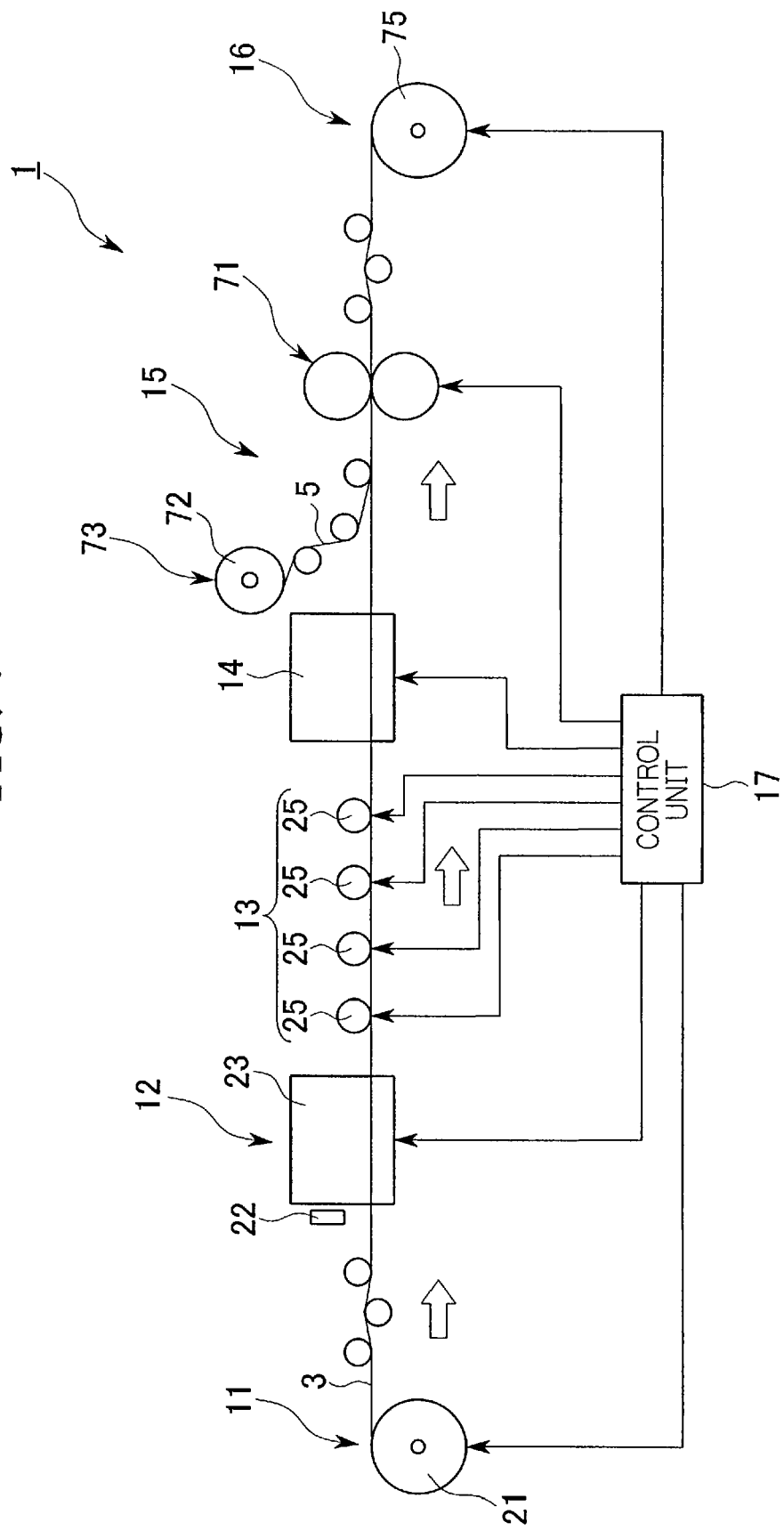
FIG. 4 is a schematic view showing an apparatus for manufacturing an IC chip packaged device according to the first embodiment of the present invention.

As is shown in FIG. 4, this apparatus 1 for manufacturing an IC chip packaged device is formed by a film substrate housing section 11 that houses the film substrate 3, an adhesive agent printing section 12 that coats the adhesive agent 6 at a position on the film substrate 3 where the IC chips 4 are to be mounted, an IC chip mounting section 13 that mounts the IC chips 4 at predetermined positions on the film substrate 3, a heater 14 that dries the adhesive agent 6, a cover sheet bonding section 15 that bonds a cover sheet 5 to a surface of the film substrate 3 where the IC chips 4 are mounted, a product winding section 16 which is wound the film substrate 3 to which the cover sheet 5 has been bonded, and a control unit 17 that controls these sections.

The film substrate housing section 11 houses a roll 21 of the film substrate 3 shown in FIG. 3, and is controlled by the control unit 17 such that the film substrate 3 moves at a constant speed and at a constant tension. Moreover, the film substrate housing section 11 is constructed such that the film substrate 3 that is fed from this film substrate housing section 11 is transported continuously towards the adhesive agent printing section 12.

The adhesive agent printing section 12 is provided with a CCD camera 22, and a printing section 23 that coats the adhesive agent 6 onto predetermined positions of the film substrate 3. The positions where the adhesive agent 6 is coated are confirmed by the CCD camera 22 and are controlled by the control unit 17. Moreover, the adhesive agent printing section 12 is constructed such that the film substrate 3 that is fed from this adhesive agent printing section 12 is transported continuously in a horizontal direction towards the IC chip mounting section 13.

The IC chip mounting section 13 is provided with four mounting apparatuses 25 that mount the IC chips 4 on the transported film substrate 3.

These mounting apparatuses 25 are formed by an IC chip supply section 26, a rotary head section 27, and a synchronized roller section 28 that are shown in FIGS. 5 through 9.

Figure 5:
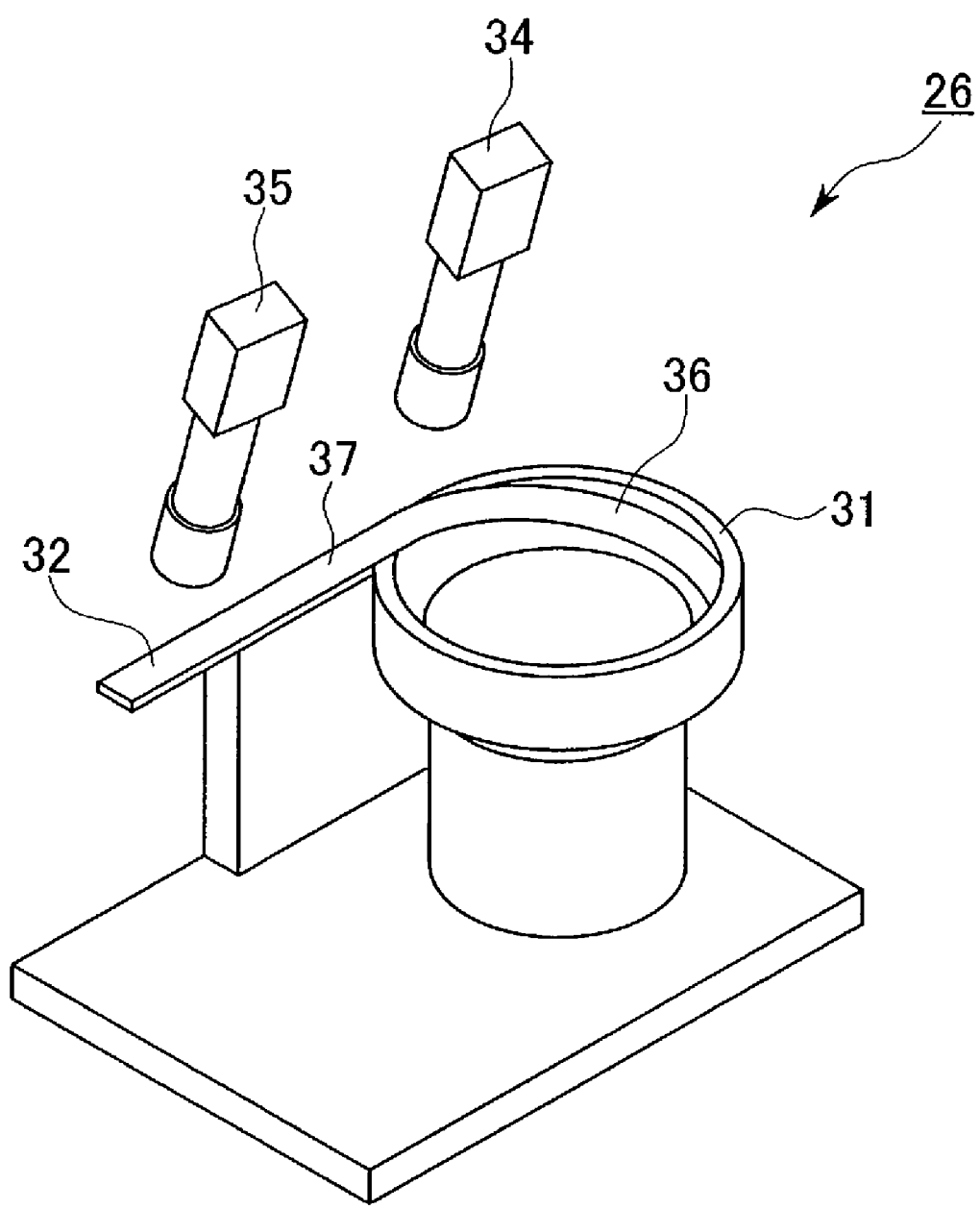
FIG. 5 is a perspective view showing the IC chip supply section shown in FIG. 4.

As is shown in FIG. 5, the IC chip supply section 26 is formed by a bowl 31 that houses the IC chip 4, a linear feeder 32 that transports the IC chips 4 at a constant speed and in a constant direction, a return feeder (not shown) that transports the IC chips 4 from the linear feeder 32 to the bowl 31, a vibration drive (not shown) that imparts a vibration to the bowl 31, the linear feeder 32, and the return feeder, and CCD cameras 34 and 35 that each pick up an image of the IC chip 4. The method used to impart the vibration may be one in which, for example, electromagnetic vibration is used.

The bowl 31 has a spiral-shaped transporting path 36 formed on an inner circumferential wall thereof, and is constructed such that the IC chip 4 housed therein is transported at a fixed speed by the vibration along the transporting path 36 as far as a transporting path 37 of the linear feeder 32.

The linear feeder 32 is constructed such that the IC chips 4 that have been transported by the bowl 31 are transported in the same way by the vibration as far as a distal end of the transporting path 36.

The two CCD cameras 34 and 35 are positioned respectively in substantially a center and a distal end of the transporting path 37 of the linear feeder 32, and are constructed so as to transmit the image signals picked up by each one to the control unit 17.

An air blower is placed on the transporting path 37 between the CCD camera 34 and the CCD camera 35. When the control unit 17 determines that the image of an IC chip 4 that has been picked up by the CCD camera 34 shows the front surface thereof (i.e., the bumps 4b face downwards), this IC chip 4 is discharged to the return feeder.

The return feeder discharges IC chips 4 that have been discharged by the air blower to the bowl 31.

Figure 6:
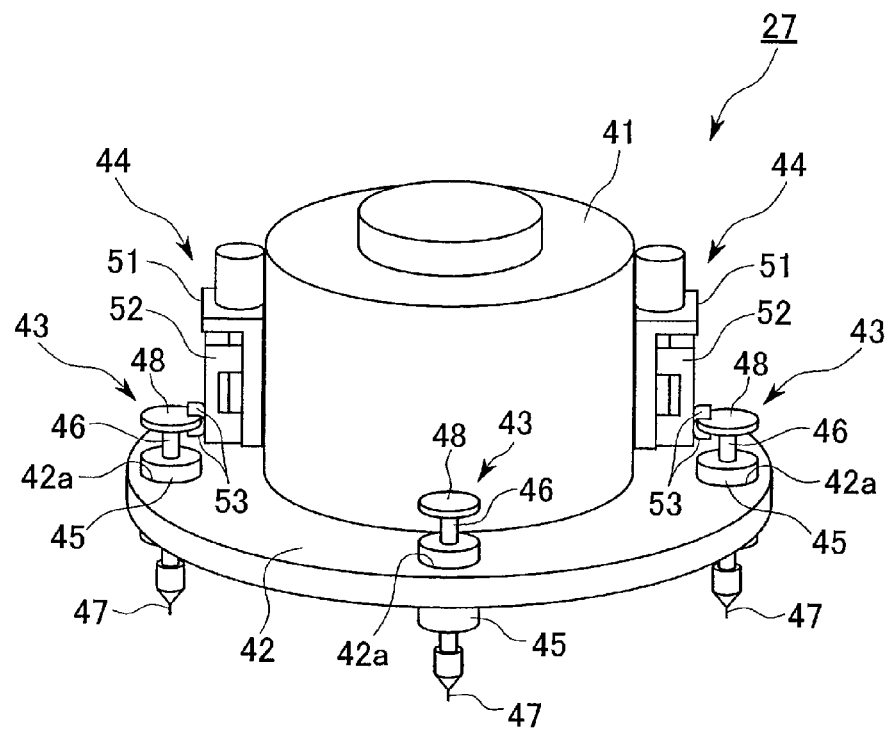
FIG. 6 is a perspective view showing the rotary head section shown in FIG. 4.

As is shown in FIG. 6, the rotary head section 27 is provided with a drive motor 41 that rotates a disk shaped plate 42, the disk plate 42 that is positioned so as to be able to rotate at a bottom surface of the drive motor 41 around the center axis of the drive motor 41 as a center of rotation, four nozzle units 43 that are placed at equal intervals in the circumferential direction of the disk plate 42, and a pair of Z axis units 44 that are provided so as to face side surfaces of the drive motor 41.

The disk plate 42 is formed, for example, from aluminum or the like, and is positioned so as to be able to rotate around the center axis of the drive motor 41 as a center of rotation. Moreover, four through holes 42a are formed at equal intervals in the circumferential direction in the disk plate 42 and the nozzle units 43 are placed therein.

The nozzle units 43 are provided with a nozzle body 45 that has a substantially cylindrical configuration, and a cylinder portion 46 that is provided so as to be able to move in a direction that is perpendicular to the disk plate 42.

The cylinder portion 46 is provided with a suction portion 47 at a distal end thereof that suctions the IC chip 4, and with a disk portion 48 at the base end thereof that engages with an engaging portion 53 of the Z axis units 44.

In the nozzle units 43, the suction portion 47 is positioned such that, when the disk plate 42 is rotated, the suction portion 47 overlaps the distal end of the transporting path 37 of the linear feeder 32 when viewed from the top surface thereof, and also overlaps suction holes 61a of a synchronized roller 61 (described below).

A θ axis rotation gear (not shown) that rotates the cylinder portion 46 around a center axis of the nozzle unit 43 as an axis of rotation is provided inside the nozzle bodies 45. This θ axis rotation gear is constructed so that it is rotated in a predetermined direction by the control unit 17 based on picked up images of the IC chip 4 that have been picked up by the CCD camera 35.

Figure 7:
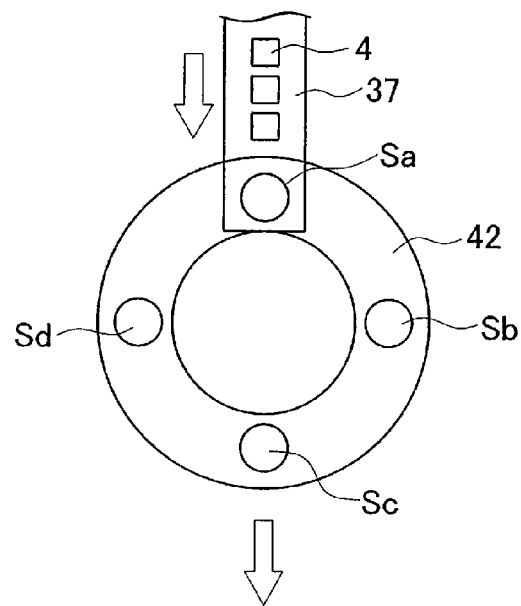
FIG. 7 is a schematic frontal view showing a stop position of a nozzle unit by an index movement of the rotary head section shown in FIG. 6.

Note that the drive motor 41 is constructed so as to perform what is known as an index movement in which the disk plate 42 is rotated by the control unit 17 intermittently in steps of 90° around a center axis of the drive motor 41 as an axis of rotation. As a result of this index movement, as is shown in FIG. 7, the nozzle units 43 are made to stop temporarily at a position Sa where, when viewed from the top surface thereof, they overlap with the distal end of the transporting path 37 of the linear feeder 32, a position Sb, a position Sc where they overlap with the suction holes 61a of the synchronized roller 61 (described below), and a position Sd.

Moreover, when the disk plate 42 is rotated, the cylinder portion 46 uses a vacuum to suction the IC chip 4 that is above the transporting path 36 at the position Sa and releases the IC chip 4 at the position Sc.

The two Z axis units 44 are positioned so as to face side surfaces of the drive motor 41, and are provided with a Z axis unit body 51 and slide portions 52 that are able to move in the Z axial direction, which is a perpendicular direction relative to the disk plate 42.

The slide portions 52 are able to be moved in the Z axial direction by an AC servo motor (not shown) that is placed inside the Z axis unit body 51. In addition, the engaging portions 53 that engage with the disk portions 48 of the nozzle units 43 are provided at a side surface of the slide portions 52 so as to protrude towards the outer side in a circumferential direction of the disk plate 42. The disk portions 48 are engaged by these engaging portions 53 and, as a result of the slide portions 52 being made to slide in the Z axial direction by the AC servo motor, the cylinder portions 46 are able to move in the Z axial direction.

Figure 8:
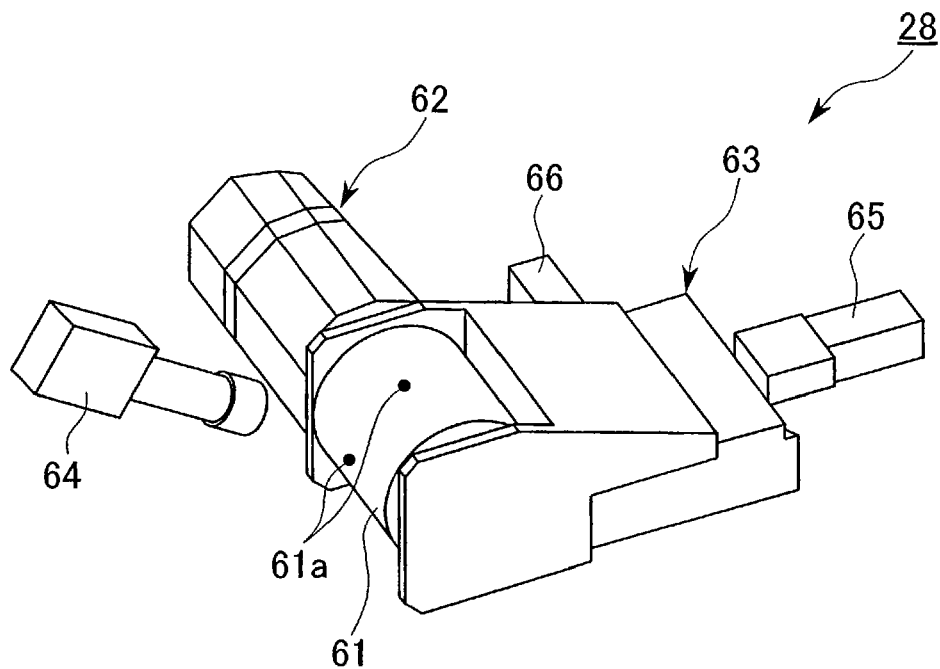
FIG. 8 is a perspective view showing the synchronized roller section shown in FIG. 4.

As is shown in FIG. 8, each synchronized roller section 28 is provided with a synchronized roller 61, a drive motor 62 that operates the synchronized roller 61, an alignment stage 63 that corrects the placement position where the IC chip 4 is placed by the synchronized roller 61, and a CCD camera 64 that picks up images of the IC chips 4 on the synchronized roller 61.

The suction holes 61a are formed in five locations at equal intervals in the circumferential direction of the synchronized roller 61, and are constructed so as to suction and hold IC chips 4 that are transported by the rotary head section 27.

Figure 9:
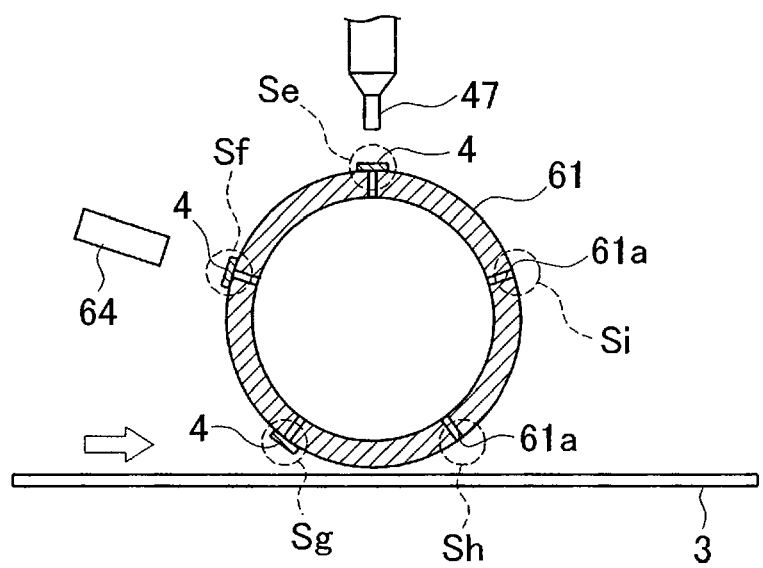
FIG. 9 is a schematic cross-sectional view showing a stop position of a suction hole by an index movement of the synchronized roller section shown in FIG. 8.

The drive motor 62 is constructed so as to perform an index movement in which the synchronized roller 61 is rotated by the control unit 17 in steps of 72° around a center axis of the synchronized roller 61 as an axis of rotation. As a result of this index movement, as is shown in FIG. 9, the suction holes 61a of the synchronized roller 61 are made to stop temporarily at a position Se that overlaps with the position Sc when viewed from a side surface, and at positions Sf to Si.

The alignment stage 63 has an X axis motor 65 and a Y axis motor 66. The alignment stage 63 makes corrections by driving the X axis motor 65 and the Y axis motor 66 as is appropriate by a correction amount that is calculated by the control unit 17 based on position information for the antenna circuit 3a on the film substrate 3 obtained from the CCD camera 22 and position information for the IC chip 4 obtained from the CCD camera 64.

Note that, of the four mounting apparatuses 25, the mounting apparatus 25 that is positioned furthest from the film substrate housing section 11 is a dedicated backup apparatus that is used to mount an IC chip 4 on an antenna circuit 3a where an IC chip 4 has not been mounted by any of the other three IC chip mounting sections 13. Namely, a structure is employed in which, if an IC chip 4 is discharged to the return feeder due to the wrong surface thereof being presented, or if an IC chip 4 is not placed on a suction hole 61a of the synchronized roller 61 due to a defect or the like and cannot consequently be mounted on the antenna circuit 3a, an IC chip 4 is supplied from the backup mounting apparatus 25 and is mounted on the antenna circuit 3a.

The heater 14 performs drying and warming processing on the adhesive agent 6 on the film substrate 3 where the IC chip 4 has been mounted.

The bonding section 15 is provided with a bonding roller 71 that bonds the film substrate 3 where IC chips have been mounted to the cover film 5, and a cover film housing section 73 that houses a roller 72 of the cover film 5.

The bonding roller 71 forms a transporting section that transports the film substrate 3 from the film substrate housing section 11 together with the product winding section 16, and is constructed so as to withdraw cover film from the cover film housing section 73 and bond the film substrate 3 together with the cover film 5.

The product winding section 16 is constructed so that an ID tag 2 that has been manufactured by bonding the cover film 5 is wound thereon and then stored as a roll 75.

Figure 10:
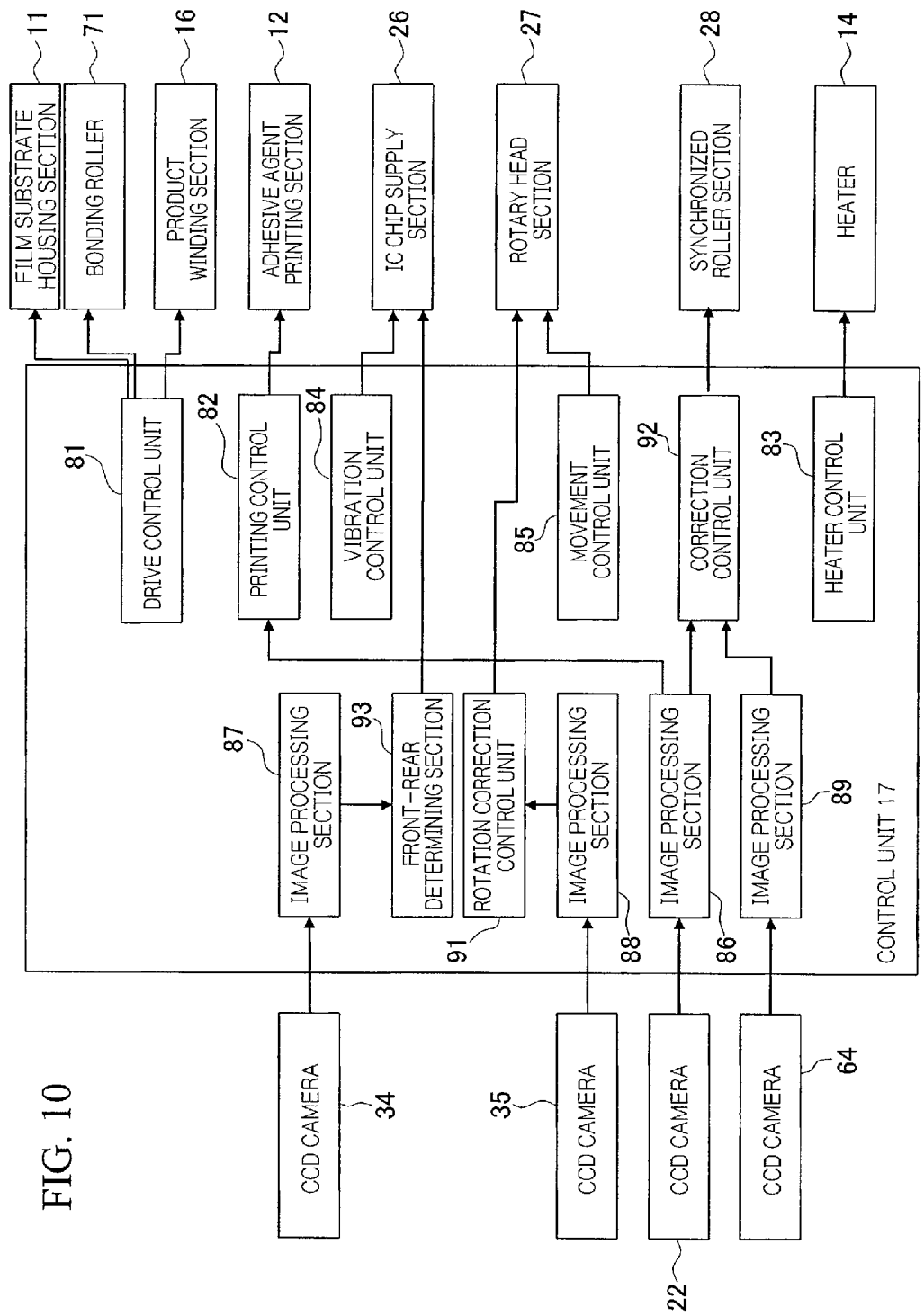
FIG. 10 is a block diagram showing the control unit shown in FIG. 4.

As is shown in FIG. 10, the control unit 17 is provided with a drive control unit 81 that controls the driving of the film substrate housing section 11, the bonding roller 71, and the product winding section 74, a printing control unit 82 that controls the driving of the adhesive agent printing section 12, a heater control unit 83 that controls the driving of the heater 14, a vibration control unit 84 that controls the vibration of the IC chip supply section 26, a movement control unit 85 that controls the index movements of the synchronized roller section 28 and the rotary head section 27, image processing sections 86, 87, 88, and 89 that perform image processing of images picked up respectively by the CCD cameras 22, 34, 35, and 64, a rotation correction control unit 91 that controls the θ axis rotation gear of the rotary head section 27 from images processed by the image processing section 88, a control correction unit 92 that transmits a correction amount to the alignment stage 63 of the synchronized roller 28 from images processed by the image processing section 89, and a front-rear determining section 93 that determines the front and rear surfaces of the IC chips 4 from images processed by the image processing section 87 and accordingly controls the IC chip supply section 26.

Figure 11:
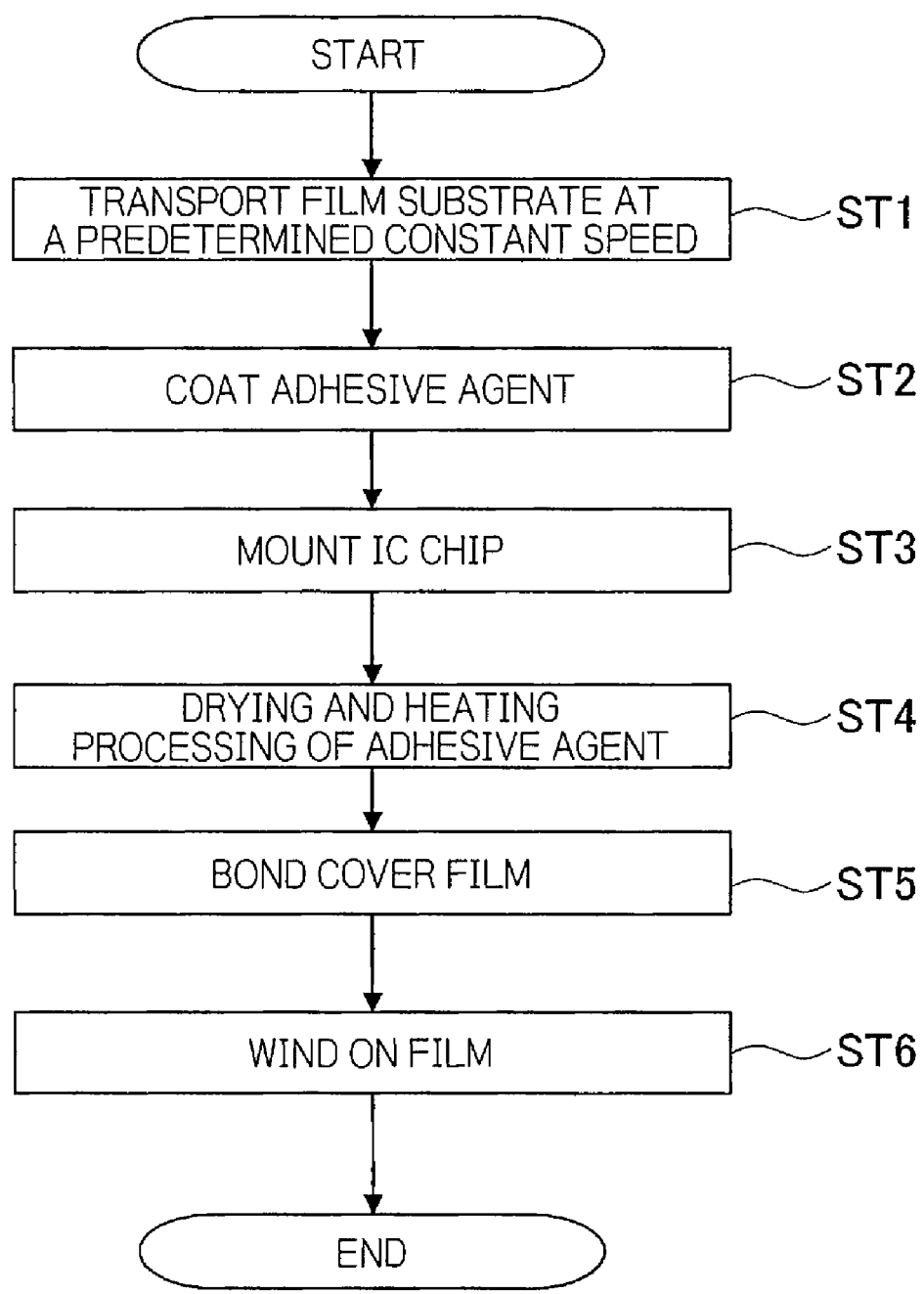
FIG. 11 is a flow chart showing a procedure for manufacturing an ID tag according to the first embodiment of the present invention.

Next, a method of manufacturing an ID tag will be described using FIG. 11.

Firstly, the bonding roller 71 and the product winding section 16 transport the film substrate 3 at a constant speed from the film substrate housing section 11 to the adhesive agent printing section 12 (step S1).

Next, the CCD camera 22 of the adhesive agent printing section 12 picks up an image of the antenna circuit 3a of the film substrate 3 and verifies the position of the antenna circuit 3a that is formed on the film substrate 3 based on images picked up by the image processing section 86. In addition, the printing section 26 coats the adhesive agent 6 at a position where an IC chip 4 is to be mounted on the film substrate 3 based on the verified position information using a coating apparatus such as, for example, a cylinder press that does not require the film substrate 3 to be stopped (step S2).

Next, the chip mounting section 13 mounts an IC chip 4 at a predetermined position on the antenna circuit 3a (step S3).

The heater 14 then heats the film substrate 3 on which the IC chip 4 has been mounted so as to cure the adhesive agent 6 and thereby fix the IC chip 4 on the film substrate 3 (step S4).

Next, the bonding section 15 bonds the cover film 5 such that it covers the antenna circuit 3a and the IC chip 4 (step S5).

Finally, the product winding section 16 winds on the film substrate 3 to which the cover film 5 has been bonded (step S6).

Figure 12:
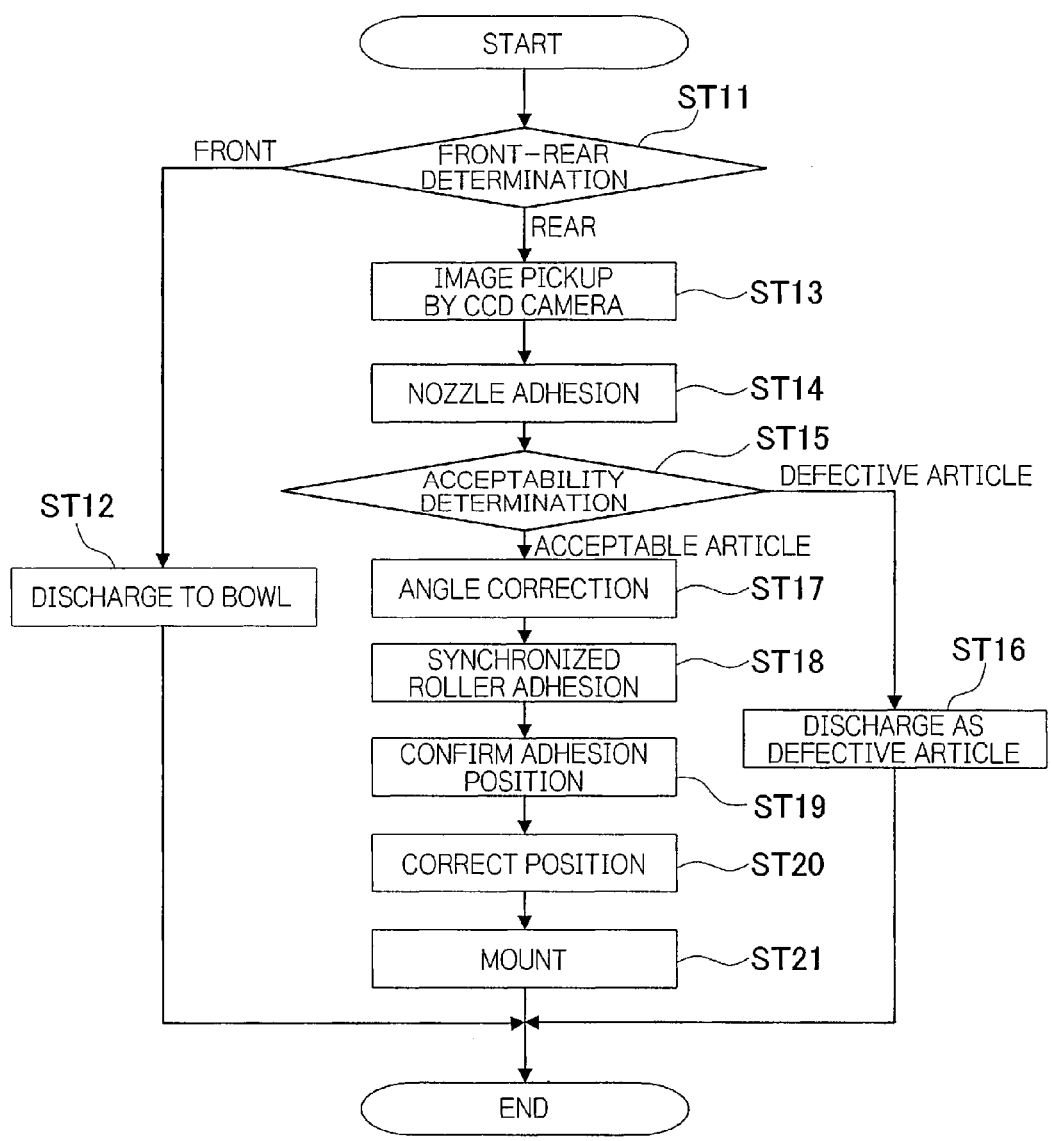
FIG. 12 is a flow chart showing a procedure for mounting the IC chip shown in FIG. 11.

Next, a method of mounting an IC chip 4 using the chip mounting section 13 will be described in detail using FIG. 12.

Firstly, as a result of the vibration control unit 84 driving a vibration drive, the IC chip supply section 26 uses vibration to transport IC chips 4 in the bowl 31 at a constant speed and at a constant interval along the transporting path 37. At this time, the CCD camera 34 picks up images from the top surface side of the IC chips 4 that are being transported along the transporting path 37 of the linear feeder 32, and the image processing section 87 of the control unit 17 determines the front and rear surfaces of the IC chips 4 whose images have been picked up from photographic images from the CCD camera 34 (step S11). Here, the surface on which the bumps 4b are provided is taken as the rear surface.

In step S11, if the image processing section 87 determines that the IC chip 4 is showing a front surface, the front-rear determining section 93 discharges this IC chip 4 to the return feeder. Discharged IC chips are transported by the return feeder to the bowl 31 (step S12).

Furthermore, in step S11, if the image processing section 87 determines that an IC chip 4 is showing a rear surface, the linear feeder 32 further transports this IC chip 4 towards the distal end of the transporting path 37. Here, the CCD camera 35 picks up an image of the IC chip 4 that has been transported to the distal end of the linear feeder 32 (step S13).

Next, the nozzle unit 43 that is at the position Sa shown in FIG. 7 suctions the IC chip at the distal end of the transporting path 37. Namely, the slide portion 52 is made to slide downwards along the Z axis while the disk plate 48 of the nozzle unit 43 is engaged with the engaging portion 53 of the Z axis unit 44. In addition, the cylinder portion 46 moves downwards along the Z axis, and the suction portion 47 suctions the IC chip 4 that has been transported along the transporting path 37 of the linear feeder 32 (step S14).

After the IC chip 4 has been suctioned, the cylinder 46 is moved upwards along the Z axis by the Z axis unit 44. In addition, the disk plate 42 makes an index movement so as to rotate 90° in a circumferential direction which results in the nozzle unit 43 being moved to the position Sb shown in FIG. 7.

At this time, the image processing section 88 of the control unit 17 determines the acceptability of the IC chip 4 whose image was picked up from the photographed image obtained by the CCD camera 35 in step S13 (step S15).

In step S15, if the image processing section 88 determines that this IC chip 4 is defective, the cylinder portion 46 releases this IC chip 4 and the nozzle unit 43 discharges it as a defective article (step S16).

Moreover, in step S15, if the image processing section 88 determines that the IC chip 4 is acceptable, the disk plate 42 makes an index movement. During this index movement, the image processing section 88 calculates the appropriate direction for mounting the IC chip 4 from the images picked up by the CCD camera 35, and the θ axis rotation gear rotates the IC chip 4 in a predetermined direction (step S17).

The nozzle unit 43 is moved to the position Sc shown in FIG. 7 by this index movement.

The rotary head section 27 slides the slide portion 52 downwards along the Z axis, and also moves the cylinder portion 46 downwards along the Z axis. Moreover, as a result of the suction portion 47 being placed against the suction hole 61a of the synchronized roller 61 and releasing the IC chip 4, the IC chip 4 is suctioned by the suction hole 61a of the synchronized roller 61 that is located at the position Se shown in FIG. 9 (step S18).

The synchronized roller 61 then makes an index movement so as to be rotated 72° by the drive motor 62. As a result, the IC chip 4 is moved to the position Sf shown in FIG. 9. Here, the CCD camera 64 picks up an image of the IC chip 4 on the synchronized roller 61 (step S19). The correction control unit 92 then calculates a correction amount for the position of the synchronized roller 61 from the position information about the antenna circuit 3a obtained from the image processing section 86 and the position information about the IC chip 4 obtained from the image processing section 89.

The synchronized roller 61 then makes a further index movement and the alignment stage 63 corrects the position of the synchronized roller 61 based on the correction amount calculated by the correction control unit 92.

The synchronized roller 61 then makes a further index movement so as to be in contact with the film substrate 3 and the IC chip 4 between the position Sg and the position Sh shown in FIG. 9. As a result, the IC chip 4 is released from the suction hole 61a and the IC chip 4 is mounted on the film substrate 3 (step S21). Note that the position on the synchronized roller 61 where it makes contact with the film substrate 3 is the opposite position to the position on the synchronized roller 61 where the IC chip 4 is released from the rotary head 27. Accordingly, at this position of contact with the film substrate 3, the IC chip 4 is placed on the film substrate 3 without being stopped by the index movement.

Note also that because an IC chip 4 may be discharged to the return feeder due to its showing its rear surface or may be discharged due to its being a defective article, there are cases when no IC chip 4 is adhered to the suction hole 61a of one of the synchronized rollers 61 of the three mounting apparatuses 25. If an IC chip 4 is not mounted on an antenna circuit 3a in this manner, the dedicated backup mounting apparatus 25 mounts its IC chip 4.

According to the apparatus for manufacturing an IC chip packaged device and to the method of manufacturing an IC chip packaged device that have the above described structure, the synchronized roller 61 moves an IC chip 4 and also mounts it on the film substrate 3 at a speed that is synchronized with the speed at which the film substrate 3 is being transported. Accordingly, because it is possible to mount an IC chip 4 without having to momentarily halt the film substrate, the efficiency with which an ID tag 2 can be manufactured is improved.

Moreover, because IC chips 4 are mounted using three mounting apparatuses 25, the number of IC chip packaged devices that can be manufactured per unit time is increased.

Furthermore, because a large number of ID tags 2 can be manufactured per unit time, a reduction in the cost of the ID tags 2 can be achieved. Moreover, because the film substrate 3 is transported at a constant velocity, there are no adverse effects on the film substrate 3.

The CCD cameras 34 and 35 pick up images of the antenna circuits 3a and the IC chips 4, and the positions where the IC chips 4 are mounted by the synchronized roller 61 are corrected by the alignment stage 63 based on the picked up images. As a result, the feed accuracy of the film substrate 3 is improved. Moreover, because it is possible to mount an IC chip 4 in a predetermined mounting position, the manufacturing yield of the IC tags 2 is improved.

When these three mounting apparatuses 25 are not able to mount IC chips 4 on antenna circuits 3a of the film substrate 3, the mounting apparatus 25 that is positioned furthest from the film substrate housing section 11 mounts an IC chip 4. As a result, the manufacturing yield of the IC tags 2 is improved even further.

Next, the second embodiment of the present invention will be described with reference made to FIG. 13.

Note that the basic structure of the embodiment described here is the same as that of the above described first embodiment, and is formed by the addition of other elements to the above described first embodiment. Accordingly, in FIG. 13, the same symbols are used for component elements that are the same as those in FIG. 9 and a description thereof is omitted.

The second embodiment differs from the first embodiment in that, in the second embodiment, a surface supporting roller section (i.e., a surface supporting section) 100 is provided that supports the film substrate 3 between a position in front of and a position behind the mounting position of the IC chip 4.

Figure 13:
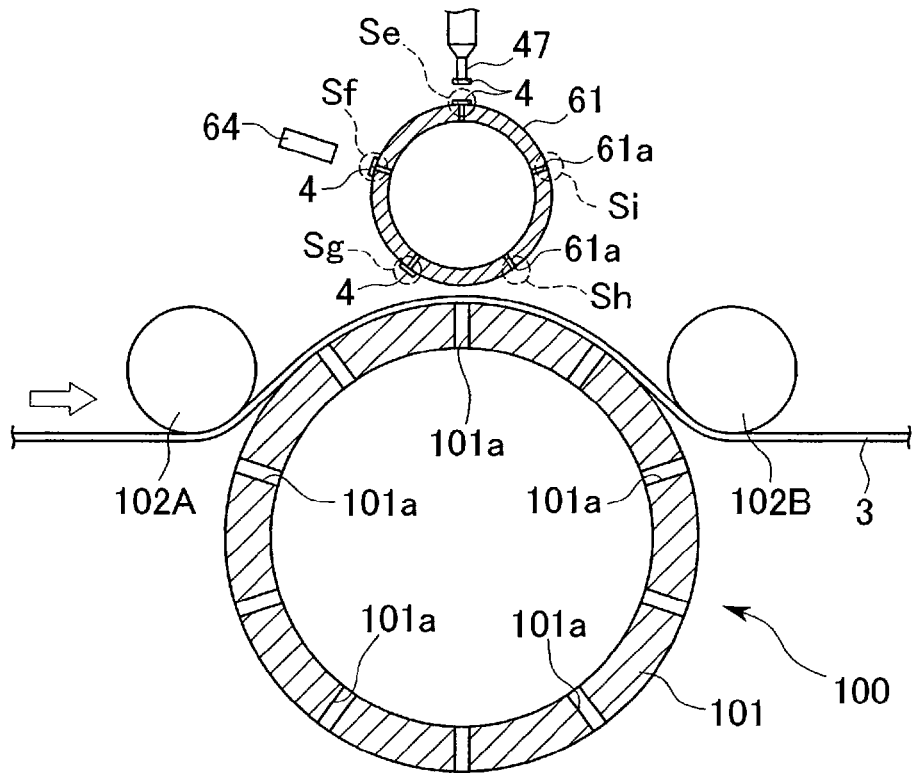
FIG. 13 is a schematic frontal view showing a synchronized roller according to the second embodiment of the present invention.

Namely, as is shown in FIG. 13, the surface supporting roller section 100 is formed by a large roller 101 that is provided facing the synchronized roller 61, and a pair of small rollers 102A and 102B that are provided facing the large roller 101 sandwiching the film substrate 3.

The large roller 101 is positioned so as to sandwich the film substrate 3 with the small roller 102A that is on the upstream side of the mounting position of the IC chip 4, and so as to sandwich the film substrate 3 with the small roller 102B that is on the downstream side of the mounting position of the IC chip 4. Accordingly, the film substrate 3 is transported over the circumferential surface of the large roller 101 from a position in front of to a position behind the mounting position of the IC chip 4.

Moreover, suction holes (i.e., a suction mechanism) 101a are formed in a plurality of locations at equal intervals in the circumferential direction of the large roller 101 so that the film substrate 3 is suctioned by a vacuum.

According to the apparatus for manufacturing an IC chip packaged device having the above described structure, because the film substrate 3 is supported by the surface from a position in front of to a position behind the mounting position of the IC chip 4 and is suctioned by a vacuum, it is possible to prevent the film substrate 3 from vibrating when an IC chip 4 is being mounted. As a result, the mounting position of the IC chip 4 is stabilized and the yield of the ID tags 2 is improved.

Figure 14:
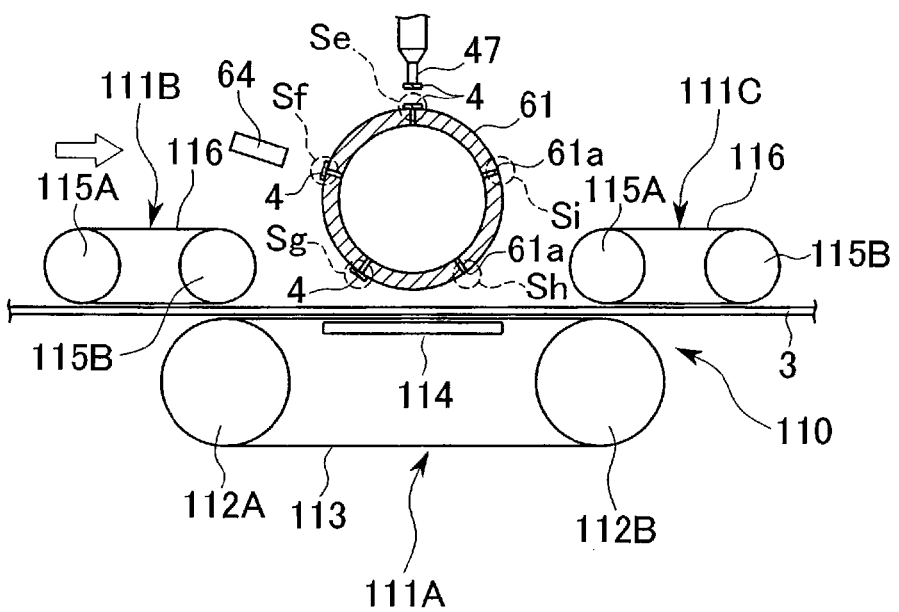
FIG. 14 is a schematic frontal view showing a surface supporting roller section to which the present invention except for the second embodiment of the present invention can be applied.

Note that, in the above described second embodiment, the surface supporting roller section 100 transports the film substrate 3 over the large roller 101 from a position in front of to a position behind the mounting position of the IC chip 4 using the large roller 101 and the small rollers 102A and 102B, however, the surface supporting roller section 110 shown in FIG. 14 may also be used.

This surface supporting roller section 110 is formed by three transporting conveyors 111A, 111B, and 111C.

The transporting conveyor 111A is formed by a pair of rollers 112A and 112B and a belt 113. A plate 114 that supports the film substrate 3 is provided at the mounting position of the IC chip 4.

In the same way as the transporting conveyor 111A, the transporting conveyors 111B and 111C are formed by pairs of rollers 115A and 115B and belts 116.

The film substrate 3 is transported over the belt 113 from a position in front of to a position behind the mounting position of the IC chip 4.

In this structure as well, in the same way as is described above, because the film substrate 3 is supported at the mounting position of the IC chip 4 by the plate 114, the mounting position of the IC chip 4 is stable.

Figure 15:
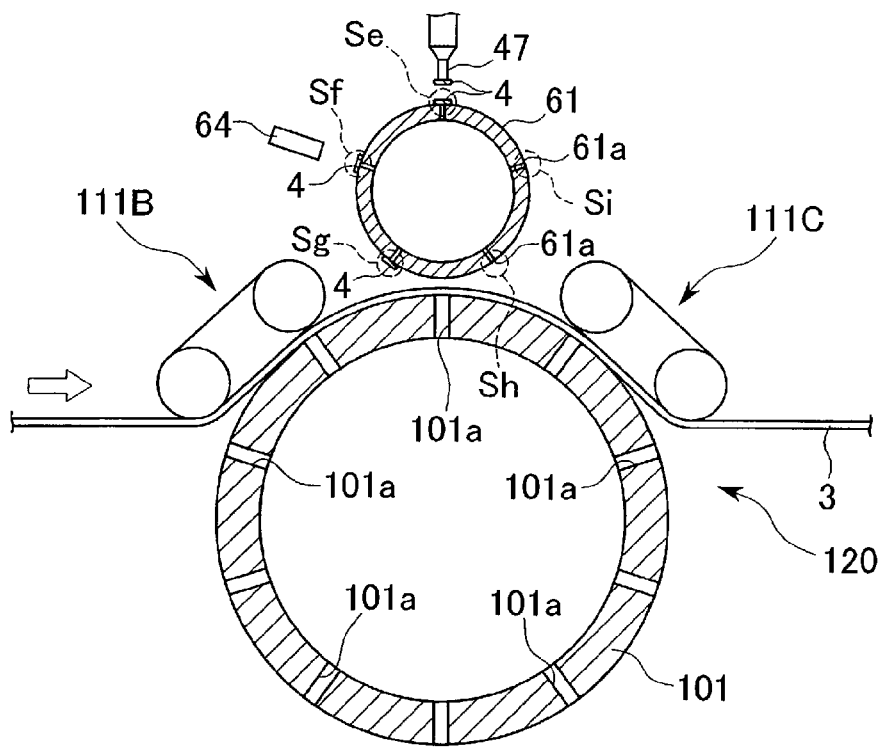
FIG. 15 is also a schematic frontal view showing a surface supporting roller section to which the present invention except for the second embodiment of the present invention can be applied.

It is also possible for the surface supporting roller section 120 shown in FIG. 15 to be used.

This surface supporting roller section 120 is formed by the large roller 101 and the transporting conveyors 111B and 111C.

In this structure as well, in the same way as is described above, because the film substrate 3 is supported from a position in front of to a position behind the mounting position of the IC chip 4 by the large roller 101, the mounting position of the IC chip 4 is stable.

Next, the third embodiment of the present invention will be described with reference made to FIGS. 16 and 17.

Note that the basic structure of the embodiment described here is the same as that of the above described first embodiment, and is formed by the addition of other elements to the above described first embodiment. Accordingly, in FIGS. 16 and 17, the same symbols are used for component elements that are the same as those in FIGS. 8 and 9 and a description thereof is omitted.

The third embodiment differs from the first embodiment in that, in the first embodiment, the synchronized roller section 28 is provided with a circular column-shaped roller 61, while, in the third embodiment, a synchronized roller 131 of a synchronized roller section 130 is provided with protruding portions 131a that are formed in the circumferential direction of the synchronized roller 131.

Figure 16:
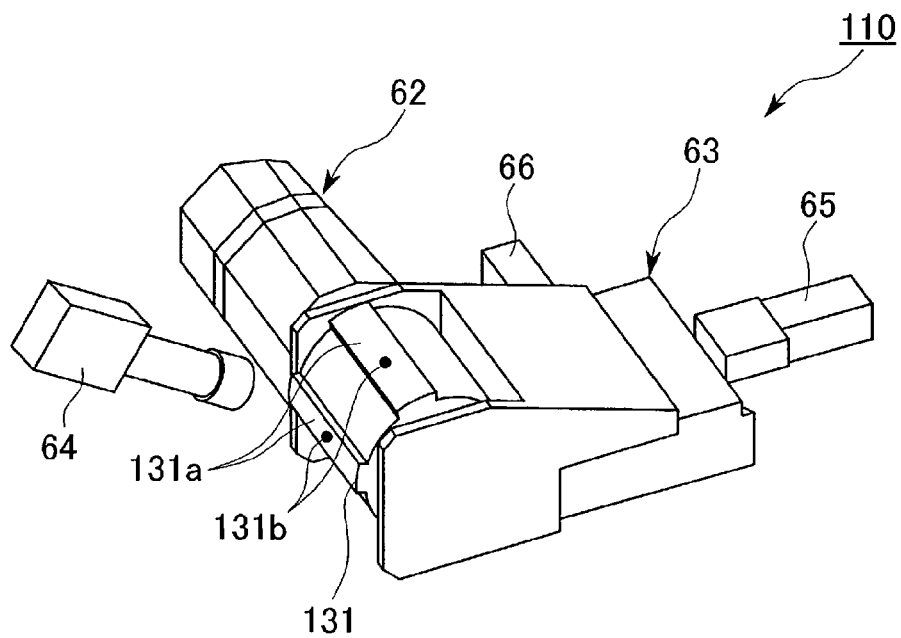
FIG. 16 is a perspective view showing a synchronized roller section according to the third embodiment of the present invention.
Figure 17:
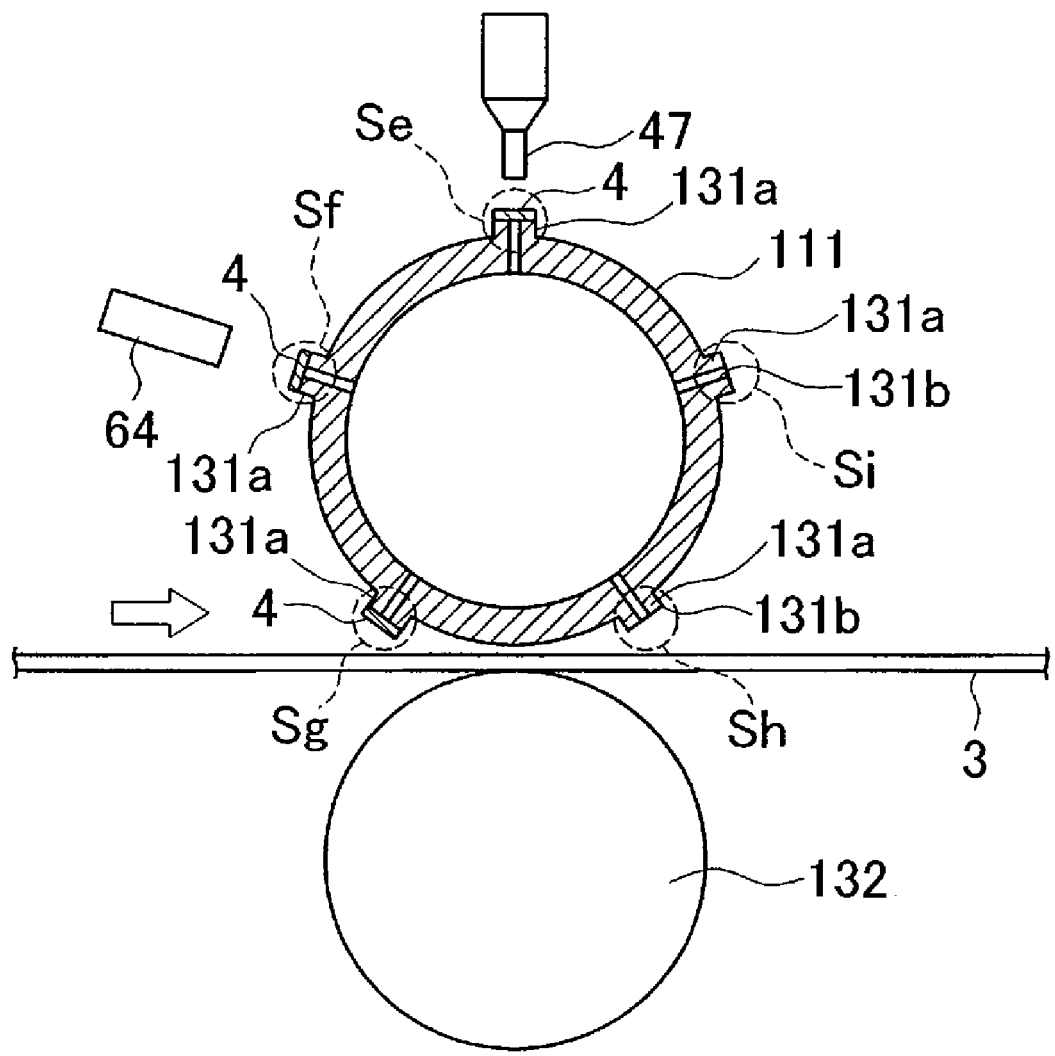
FIG. 17 is a schematic frontal view showing a stop position of a nozzle unit by an index movement of the rotary head section shown in FIG. 16.

Namely, as is shown in FIGS. 16 and 17, the synchronized roller section 130 is provided with a synchronized roller 131, a drive motor 62, an alignment stage 63, and a CCD camera 64.

Protruding portions 131a and suction holes 131b are formed at five locations in the synchronized roller 131 at equal intervals in the circumferential direction thereof These protruding portions 131a are formed such that, when the synchronized roller 131 is rotated, distal ends of the protruding portions 131a are in contact with the film substrate 3. An auxiliary roller 132 that transports the film substrate 3 is also provided at a position facing the synchronized roller 61 while sandwiching the film substrate 3.

In the same way as in the above described first embodiment, an apparatus for manufacturing an IC chip packaged device that is provided with the synchronized roller section 130 that is formed in the manner described above suctions an IC chip 4 from the rotary head section 27 to a suction hole 131b of the synchronized roller 131 that is in the position Se shown in FIG. 17.

Next, the synchronized roller 131 makes two index movements using the drive motor 62 so as to move the IC chip 4 to the position Sg that is shown in FIG. 17. If it then makes a further index movement, then at the IC chip mounting position between the position Sg and the position Sh shown in FIG. 17, a protruding portion 131a is placed against the film substrate 3. The IC chip 4 is then released and is mounted on the film substrate 3. Here, because the protruding portions 131a have been provided, the IC chip 4 is mounted while the rotation axis of the synchronized roller 111 is kept constant and the synchronized roller 11 is prevented from moving up and down.

Subsequently, an ID tag is manufactured using the same procedure as that of the above described first embodiment.

According to the synchronized roller section 130 that is formed in the above described manner, because the protruding portions 131a are formed on the synchronized roller 131, it is not necessary to move the synchronized roller 131 in a downward direction at the mounting position of the IC chips 4. As a result, there is no up and down movement of the synchronized roller 131 and the mounting position of the IC chips is stable.

While preferred embodiments of the invention have been described and illustrated above, it should be understood that these are exemplary of the invention and are not to be considered as limiting. Additions, omissions, substitutions, and other modifications can be made without departing from the spirit or scope of the present invention.

For example, the manufacturing apparatus described in the above embodiments is an apparatus for manufacturing ID tags, however, it may also be applied to cards on which IC chips are packaged.

Moreover, the IC chip mounting section is provided with four mounting apparatuses, however, it is also possible for only one mounting apparatus or a different number of mounting apparatuses to be provided.

Furthermore, only one dedicated backup mounting apparatus is provided, however, it is also possible for a plurality or none of these to be provided.

In addition, antenna circuits are formed in advance on the film substrate, however, it is also possible for a film substrate on which no antenna circuits have been formed to be supplied by providing an apparatus to manufacture antenna circuits in front of the adhesive agent printing apparatus.

Moreover, it is also possible to employ a structure in which the cover film covers the antenna circuits and the IC chips by sandwiching them.

It is also possible for the film substrate roller 21 to be freely rotatable.

It is also possible for the drive motor 41 to be built inside the casing.

INDUSTRIAL APPLICABILITY

According to the method of manufacturing an IC chip and the apparatus for manufacturing an IC chip of the present invention, it is possible to manufacture IC chip packaged devices at high speed, and the applicability of this in the field of industry is recognized.

The invention claimed is:

1. A method of manufacturing an IC chip packaged device comprising:
    transporting a film substrate that has antenna circuits formed at a fixed spacing on one surface thereof at a constant speed, and
    mounting IC chips along the film substrate, at the fixed spacing on the film substrate by one of a plurality of synchronized roller sections provided along the direction in which the film substrate is transported so as to be connected to the antenna circuits.

2. The method of manufacturing an IC chip packaged device according to claim 1, wherein an image of the IC chip is picked up, a correction amount for correcting the position where the IC chip is to be mounted is then calculated from the picked up image, and the position where the IC chip is to be mounted is then corrected.

3. An apparatus for manufacturing an IC chip packaged device comprising:
    a transporting section that transports a film substrate that has antenna circuits formed at a fixed spacing on one surface thereof at a constant speed; and
    an IC chip mounting section that mounts IC chips on the film substrate,
    wherein the IC chip mounting section is provided with: a synchronized roller section that, while moving the IC chips along the film substrate, mounts the IC chips at the fixed spacing on the film substrate that is being transported at the constant speed; and an IC chip supply section that supplies the IC chips to the synchronized roller section, and
    the IC chip mounting section is provided with a plurality of the synchronized roller sections along the direction in which the film substrate is transported by the transporting section.

4. The apparatus for manufacturing an IC chip packaged device according to claim 3, wherein, of the plurality of synchronized roller sections, at least one is a dedicated backup synchronized roller section that mounts an IC chip on the antenna circuit where an IC chip has not been mounted by the other synchronized roller sections.

5. An apparatus for manufacturing an IC chip packaged device comprising:
    a transporting section that transports a film substrate; and
    an IC chip mounting section that mounts IC chips on the film substrate,
    wherein the transporting section has a surface supporting section that supports on its surface the film substrate from a position in front of a mounting position where the IC chip is mounted by the IC chip mounting section to a position behind the mounting position,
    the IC chip mounting section has a synchronized roller section that, while moving the IC chips at the same speed as the film substrate, mounts the IC chips on the film substrate, and an IC chip supply section that supplies the IC chips to the synchronized roller section,
    the surface supporting section has an arc shape protruding toward the IC chip mounting section.

6. The apparatus for manufacturing an IC chip packaged device according to claim 5, wherein the surface supporting section has a suction mechanism that suctions the film substrate.

7. An apparatus for manufacturing an IC chip packaged device comprising:
    a transporting section that transports a film substrate; and
    an IC chip mounting section that mounts IC chips on the film substrate,
    wherein the IC chip mounting section has a synchronized roller section that, while moving the IC chips at the same speed as the film substrate, mounts the IC chips on the film substrate, and an IC chip supply section that supplies the IC chips to the synchronized roller section,
    the synchronized roller section is provided with a roller that axially rotates around an axis of rotation and mounts the IC chips on the film substrate, and protruding portions that hold the IC chips at a distal end portion are formed on a circumferential surface of the roller at equal intervals in the circumferential direction thereof,
    the IC chip mounting section is provided with a plurality of the synchronized roller sections along the direction in which the film substrate is transported by the transporting section.

8. The method of manufacturing the IC chip packaged device according to claim 1,
    wherein of the plurality of synchronized roller sections, at least one is a dedicated backup synchronized roller section and
    the dedicated backup synchronized roller section mounts an IC chip on the antenna circuit where an IC chip has not been mounted by the other synchronized roller sections.

9. The apparatus for manufacturing an IC chip packaged device according to claim 5, wherein the transporting section is further provided with a pair of small rollers that are provided facing the surface supporting section sandwiching the film substrate.

10. The apparatus for manufacturing an IC chip packaged device according to claim 7, wherein of the plurality of synchronized roller sections at last one is a dedicated backup synchronized roller section that mounts an IC chip on the antenna circuit where an IC chip has not been mounted by the other synchronized roller sections.

11. The apparatus for manufacturing an IC chip packaged device according to claim 7,
    wherein the axis of rotation of the roller of the synchronized roller section is kept in a state parallel to the transported film substrate and vertical to the direction where the film substrate is transported, and the synchronized roller section mounts IC chips on the film substrate without moving up and down.

12. The apparatus for manufacturing an IC chip packaged device according to claim 7, wherein as a result of an index movement the IC chip supply section supplies the IC chips to the synchronized roller section in a state where the synchronized roller section chips, and the synchronized roller section mounts IC chips on the film substrate in a state where the roller of the synchronized roller section rotates.

13. The method as claimed in claim 1 wherein the synchronized roller sections are disposed on a common circumferential surface.

* * * * *